United States Patent
Kao et al.

(10) Patent No.: US 8,397,380 B2
(45) Date of Patent: Mar. 19, 2013

(54) CONTROLLING WARPAGE IN BGA COMPONENTS IN A RE-FLOW PROCESS

(75) Inventors: Chia-Jen Kao, Hsin-Chu (TW);
Chen-Fa Tsai, Kaohsiung Country (TW); Chien-Wen Chen, Xizhi (TW)

(73) Assignees: Taiwan Semiconductor Manufacturing Company, Ltd., Hsin-Chu (TW);
Global Unichip Corp., Hsinchu (TW)

( * ) Notice: Subject to any disclaimer, the term of this patent is extended or adjusted under 35 U.S.C. 154(b) by 176 days.

(21) Appl. No.: 12/730,857

(22) Filed: Mar. 24, 2010

(65) Prior Publication Data

US 2010/0302749 A1    Dec. 2, 2010

Related U.S. Application Data

(60) Provisional application No. 61/182,939, filed on Jun. 1, 2009.

(51) Int. Cl.
*H05K 3/34* (2006.01)
(52) U.S. Cl. ............ 29/840; 29/825; 29/846; 29/852
(58) Field of Classification Search .......... 29/825, 29/830, 840, 846, 852
See application file for complete search history.

(56) References Cited

U.S. PATENT DOCUMENTS

| | | | |
|---|---|---|---|
| 6,281,046 B1 * | 8/2001 | Lam | 438/113 |
| 6,518,090 B2 * | 2/2003 | Dotta et al. | 438/106 |
| 6,608,389 B1 * | 8/2003 | Hashimoto | 257/784 |
| 6,697,261 B2 * | 2/2004 | Matsuda | 361/767 |
| 6,864,434 B2 * | 3/2005 | Chang et al. | 174/255 |
| 7,259,465 B2 * | 8/2007 | Soga et al. | 257/779 |
| 7,489,518 B2 * | 2/2009 | Matsuda | 361/767 |
| 7,745,907 B2 * | 6/2010 | Lee et al. | 257/621 |
| 7,951,699 B2 * | 5/2011 | Iwasaki et al. | 438/613 |
| 2002/0121693 A1 * | 9/2002 | Milla et al. | 257/738 |

FOREIGN PATENT DOCUMENTS
JP    2008199063 A  *  8/2008

* cited by examiner

*Primary Examiner* — Carl Arbes
(74) *Attorney, Agent, or Firm* — Slater & Matsil, L.L.P.

(57) ABSTRACT

A method of manufacturing an integrated circuit package includes providing a ball grid array (BGA) module including BGA balls on a side of the BGA module; providing a base substrate; and placing the BGA module on the base substrate. The BGA balls are placed between the BGA module and the base substrate. An adhesive is applied between and contacting the BGA module and the base substrate. The adhesive is then cured. The BGA balls are re-flowed after the step of curing the adhesive.

15 Claims, 6 Drawing Sheets

US 8,397,380 B2

CONTROLLING WARPAGE IN BGA COMPONENTS IN A RE-FLOW PROCESS

This application claims the benefit of U.S. Provisional Application No. 61/182,939 filed on Jun. 1, 2009, entitled "Controlling Warpage in BGA Components in a Re-flow Process," which application is hereby incorporated herein by reference.

TECHNICAL FIELD

This invention relates generally to manufacturing processes of integrated circuits, and more particularly to packaging processes, and even more particularly to methods for improving the reliability in mounting ball grid array (BGA) modules onto printed circuit boards (PCBs).

BACKGROUND

Modern integrated circuits are formed on semiconductor chips. To increase manufacturing throughput and to lower manufacturing costs, the integrated circuits are manufactured in semiconductor wafers, each containing many identical semiconductor chips. After the integrated circuits are manufactured, semiconductor chips are sawed from the wafers and packaged before they can be used.

In typical packaging processes, semiconductor chips (also referred to as dies in the art) are first attached to package substrates. This includes physically securing the semiconductor chips on the package substrates, and connecting bonding pads on the semiconductor chips to bonding pads on the package substrates. Underfill, which typically comprises epoxy, is used to further secure the bonding. The semiconductor chips may be bonded using either flip-chip bonding or wire bonding. The resulting packages are referred to as ball grid array (BGA) modules. A plurality of chips having different functions may be integrated in a same BGA module to form a system-in-package (SIP) module.

The BGA modules may be mounted onto printed circuit boards (PCBs) through BGA balls, which are attached to the bond pads on the surface of the BGA modules. In a typical surface mounting process, a BGA module is first placed onto a PCB. A re-flow is then performed so that the BGA balls are melted to join the BGA module to the PCB.

The conventional surface mounting technology suffers from drawbacks. Referring to FIG. 1, BGA module 10, which includes BGA balls 12, is placed on PCB 14. During the re-flow process, the temperatures of BGA module 10 and PCB 14 are elevated. As a result, warpage occurs to BGA module 10. With the warpage, although BGA balls 12 at the center of PCB 14 may still contact PCB 14, the edges of BGA module 10 curve up, and hence are spaced apart from PCB 14. The BGA balls 12 at the edges of BGA module 10 thus may not be able to contact PCB 14. The situation is further worsened by the warpage of PCB 14. During the re-flow, the edges (or corners) of PCB 14 are clamped to the underlying platform (not shown), and hence due to the thermal expansion, PCB 14 warps with the edges curving down. This further increases the distance between the edges of BGA module 10 and PCB 14.

FIG. 2 illustrates a cross-sectional view of the structure shown in FIG. 1, wherein the cross-sectional view is obtained from a vertical plane crossing line 2-2 in FIG. 1. For illustration purposes, the warpage of BGA module 10 and PCB 14 are exaggerated. It is noted that due to the warpage, BGA balls 12 (refer to BGA balls $12_1$), which are located away from the center of BGA module 10, become elongated. This is often characterized as insufficient solder although the real problem is not caused by the shortage of solder. Rather, the problem is that at the locations of BGA balls $12_1$, the spacing between BGA module 10 and PCB 14 is greater than designed. In addition, at the edges of BGA module 10, BGA balls $12_2$ cannot even contact the pads on PCB 14, and hence an open circuit occurs. A solution is thus needed to solve the above-discussed problems to increase production yield.

SUMMARY OF THE INVENTION

In accordance with one aspect of the present invention, a method of manufacturing an integrated circuit package includes providing a ball grid array (BGA) module including BGA balls on a side of the BGA module; providing a base substrate; and placing the BGA module on the base substrate. The BGA balls are placed between the BGA module and the base substrate. An adhesive is applied between and contacting the BGA module and the base substrate. The adhesive is then cured. The BGA balls are re-flowed after the step of curing the adhesive.

In accordance with another aspect of the present invention, a method of manufacturing an integrated circuit package includes providing a BGA module including BGA balls on a side of the BGA module; providing a printed circuit board (PCB); applying an adhesive on the PCB; placing the BGA module on the PCB, with edges of the BGA module contacting the adhesive, wherein the BGA balls are between the BGA module and the PCB; heating the BGA module and the PCB to cure the adhesive; and re-flowing the BGA balls after the adhesive is cured.

In accordance with yet another aspect of the present invention, an integrated circuit package includes a BGA module; a base substrate; BGA balls between and contacting the BGA module and the base substrate; and an adhesive between and contacting the BGA module and the base substrate. The adhesive includes discrete portions distributed along edges of the BGA module, and has a curing temperature lower than a start-melting temperature of the BGA balls.

The advantageous features of the present invention include improved yield in the surface mounting processes for mounting BGA modules onto PCBs. Also, minimum additional processes are needed, and no change to the existing re-flow process is required.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the present invention are discussed in detail below. It should be appreciated, however, that the embodiments provide many applicable inventive concepts that can be embodied in a wide variety of specific contexts. The specific embodiments discussed are merely illustrative of specific ways to make and use the invention, and do not limit the scope of the invention.

A novel surface mounting method is provided in accordance with an embodiment. The variations of the embodiment are then discussed. Throughout the various views and illustrative embodiments of the present invention, like reference numbers are used to designate like elements.

Figure 1:
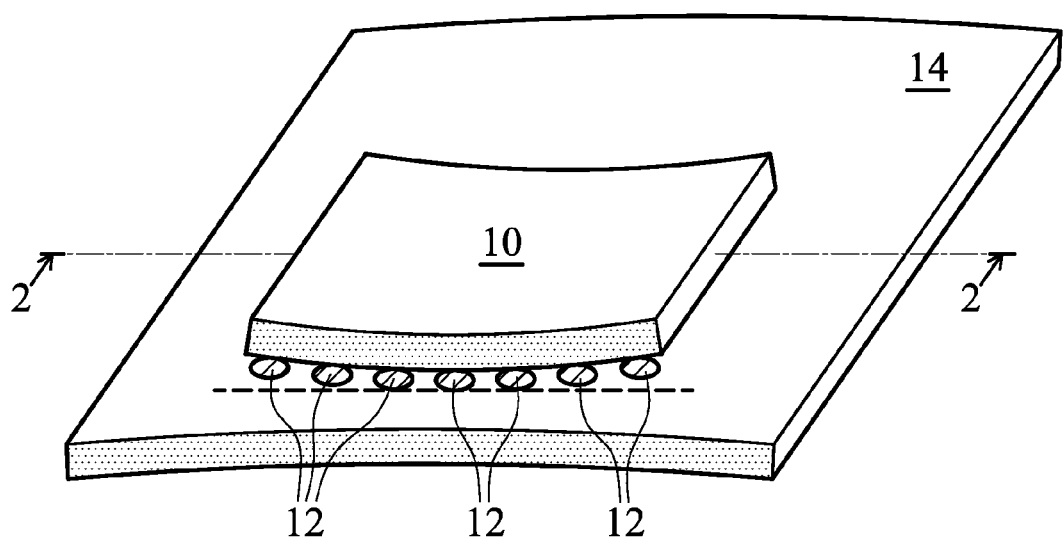
FIGS. 1 and 2 illustrate a perspective view and a cross-sectional view, respectively, of a ball grid array (BGA) module placed on a printed circuit board (PCB)
Figure 2:
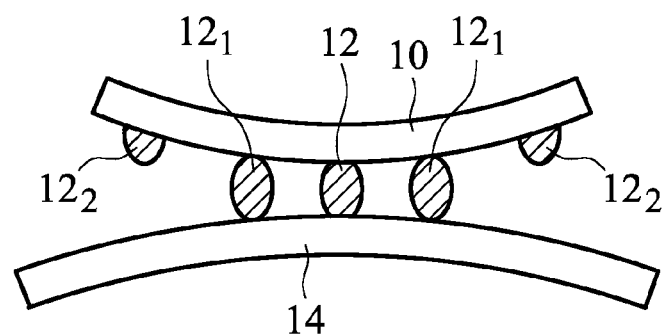
Figure 3A:
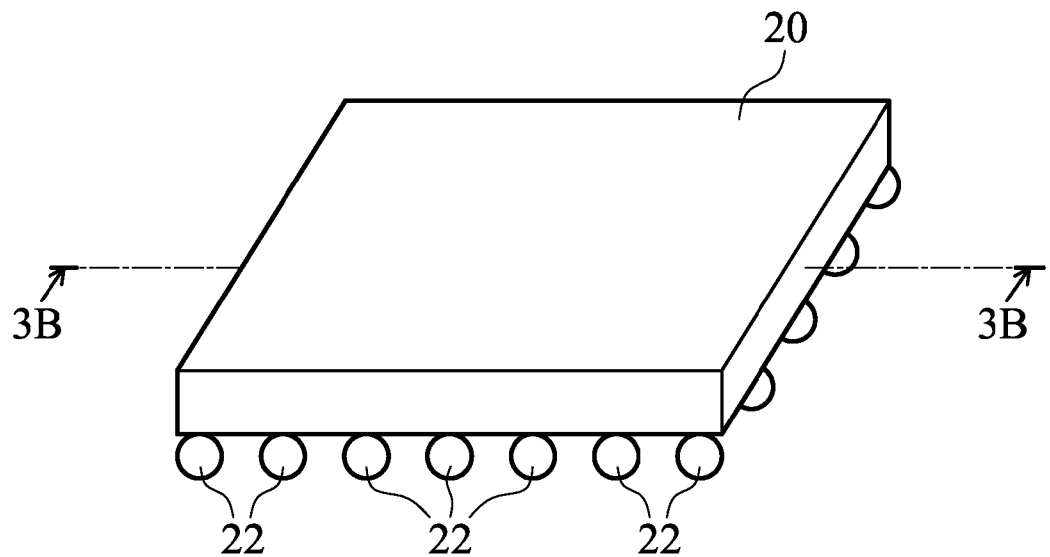
FIGS. 3A and 3B illustrate a perspective view and a cross-sectional view, respectively, of an exemplary BGA module.
Figure 3B:
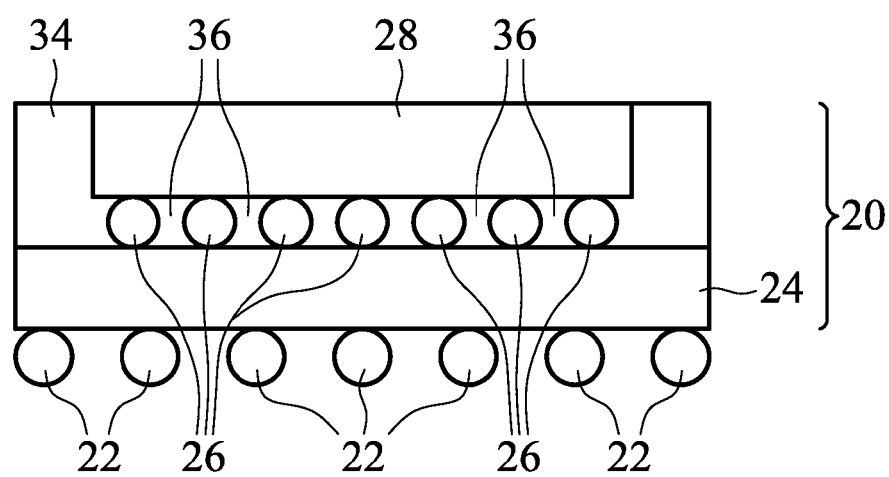

FIG. 3A illustrates a perspective view of ball grid array (BGA) module 20. FIG. 3B illustrates a cross-sectional view of an exemplary BGA module 20, which includes package substrate 24 and die 28 mounted on package substrate 24. BGA balls 22 are mounted on one side of BGA module 20, and are electrically connected to the circuits (not shown) in die 28 through BGA balls 26 and metal traces (not shown) in package substrate 24. BGA module 20 may also include molding compound 34 and underfill 36. It is noted that BGA module 20 may have many embodiments. For example, the bonding between die 28 and package substrate 24 may be flip-chip bonding as shown in FIG. 3B. Alternatively, wire bonding may be used to electrically connect die 28 to package substrate 24. BGA module 20 may include one or more dies, and may be a system-in-package (SIP) module that includes more than one die having different functionalities, and hence forming a functional system.

Figure 4:
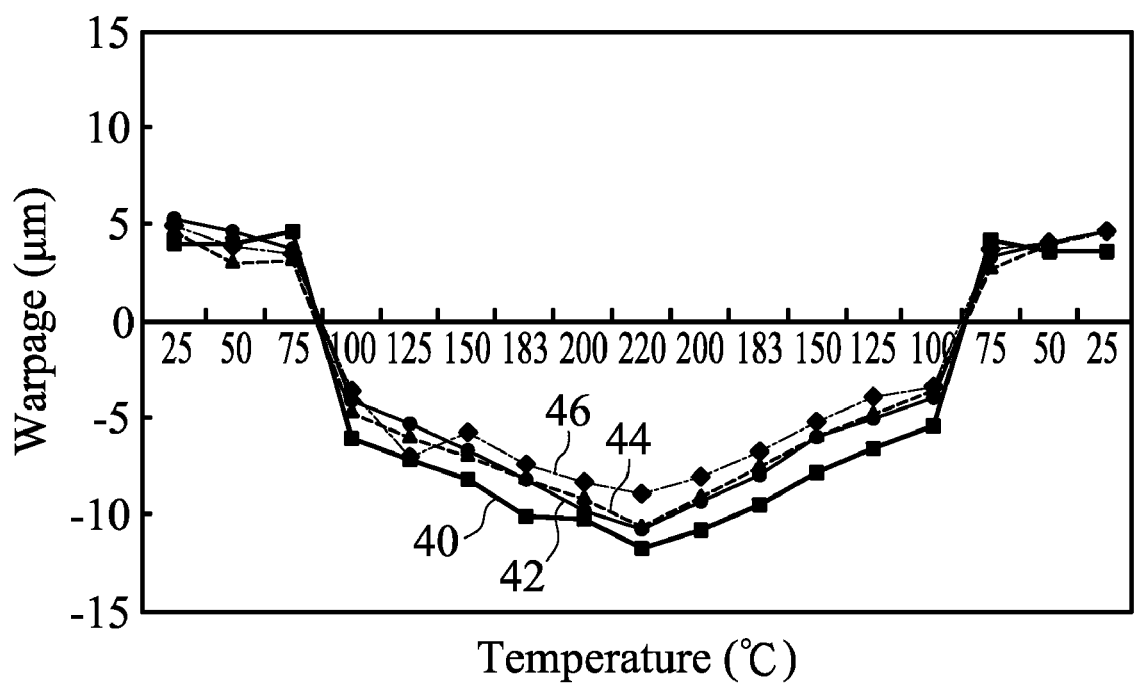
FIG. 4 illustrates warpages in BGA modules as a function of temperature.

FIG. 4 illustrates experiment results showing warpages as a function of temperatures. Throughout the description, when a BGA module is placed with the BGA balls facing down, and the warpage causes the edges of the BGA module to be higher than the center of the BGA module, the warpage is referred to as having a negative value, and is referred to as a negative warpage. Conversely, if the edges are lower than the center of the BGA module, the warpage is referred to as having a positive value, and is referred to as a positive warpage. For example, in FIG. 6, the vertical distance D between the center and the edge of BGA module 20 is referred to as the warpage, and BGA module 20 in FIG. 6 has a negative warpage.

In the experiments, thermal cycles are performed on four BGA-module samples. In the thermal cycles, the temperatures of the BGA-module samples are increased, and the warpage of the BGA-module samples are measured. Accordingly, lines 40, 42, 44, and 46 are obtained, with each line being obtained from one of the samples. It is observed that at a temperature close to about 70° C., the warpages of the samples become negative. With further increases in the temperature, the warpages also increase (in a negative direction), until at about 220° C. when the temperature starts to decrease. When the temperatures decrease, the warpages reduce until eventually back to positive values. The materials and the structure of the BGA modules affect their warpages, and the thermal response may vary from one BGA module to another.

Figure 5A:
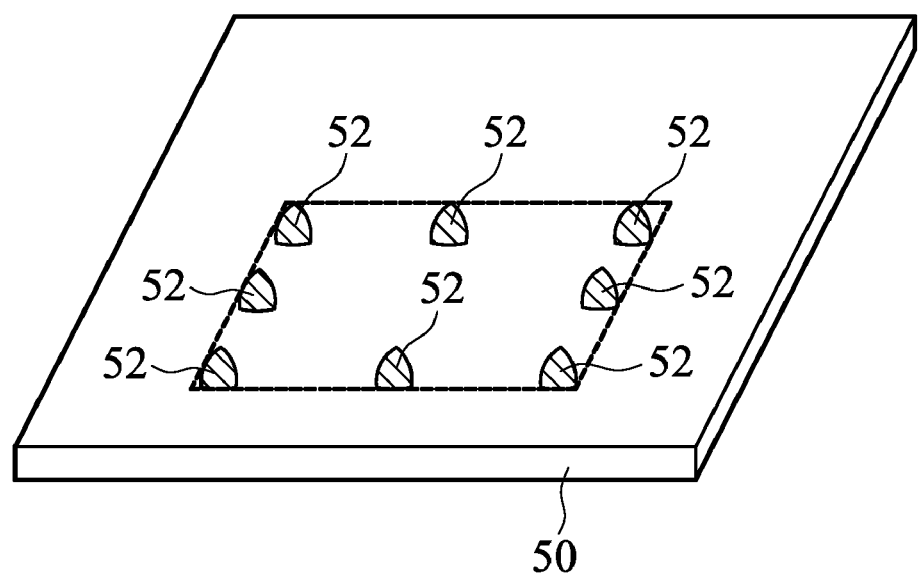
FIGS. 5A and 5B are perspective views showing adhesive drops or strips applied on PCBs.
Figure 5B:
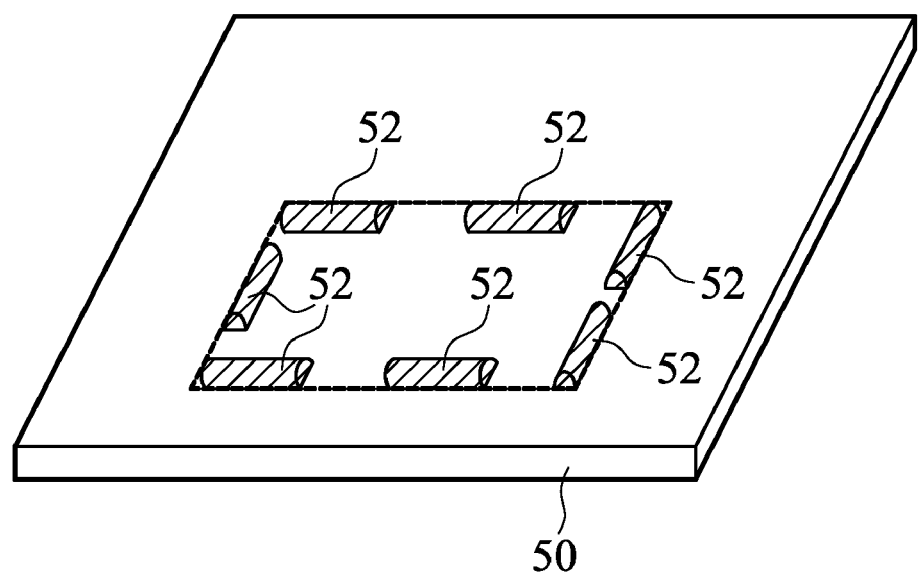

FIGS. 5A and 5B illustrate base substrate 50, on which BGA module 20 is to be mounted. Throughout the description, base substrate 50 is referred to as printed circuit board (PCB) 50, since it may be a PCB, although it may also be any other type of substrate including, but not limited to, FR-4, CEM-3, or the like. Adhesive 52 (also referred to as glue 52 hereinafter) is applied to desirable locations of PCB 50. Glue 52 may be a liquid having a viscosity high enough so that it may stay where it is applied. In an embodiment, as shown in FIG. 5A, glue 52 is applied as discrete drops at locations corresponding to edges and/or corners of BGA modules 20 to be mounted on PCB 50 (refer to FIG. 6). In alternative embodiments as shown in FIG. 5B, glue 52 may be applied in any other shape such as strips. Preferably, glue 52 has portions corresponding to all edges. Alternatively, glue 52 may be applied to locations corresponding to three edges, or two opposite edges, of BGA module 20. Glue 52 may also be applied to locations corresponding to all four corners, or at least three corners, or at least two opposite corners, of BGA module 20. Corresponding to each edge of BGA module 20, there may be at least three drops of glues, although more or fewer drops may be applied. The height of glue 52 needs to be greater than the diameter of BGA balls 22. In yet other embodiments, glue 52 may be applied to other locations, such as corresponding to the center of BGA module 20, providing no BGA balls 22 are at these locations.

Figure 6:
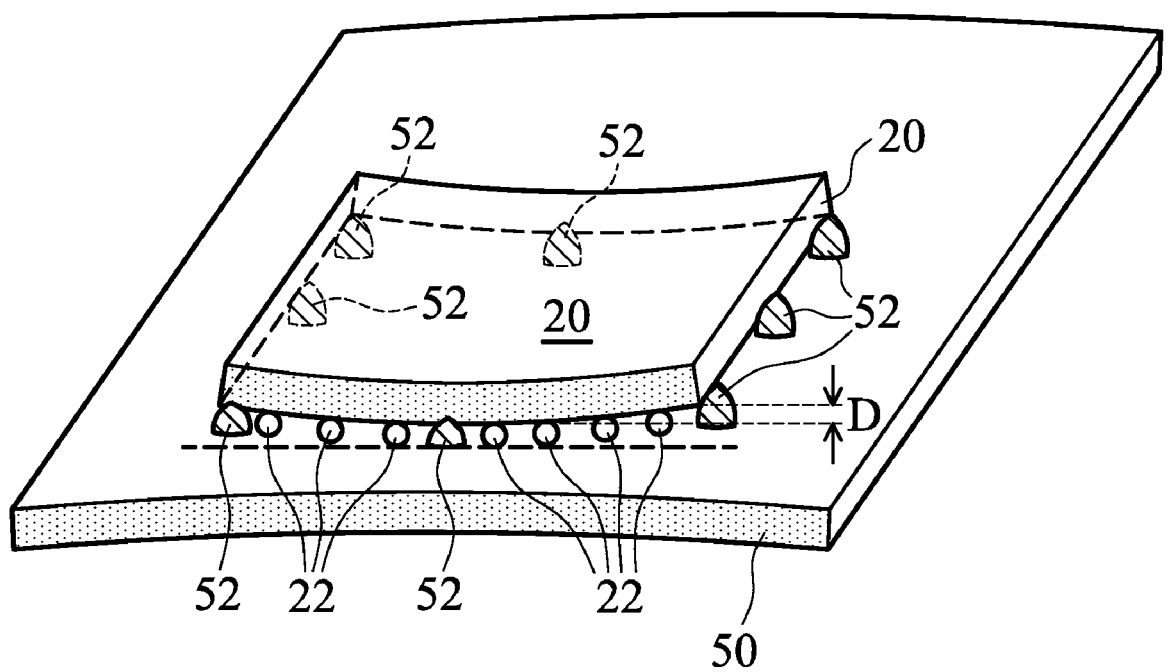
FIG. 6 illustrates a BGA module placed onto a PCB.

Referring to FIG. 6, BGA module 20 is picked up and placed on PCB 50, with BGA balls 22 contacting the corresponding connection structure on PCB 50. After the placement, BGA balls 22 preferably do not contact glue 52. Glue 52 joins both BGA module 20 and PCB 50. Again, BGA balls 22 also need to contact the underlying PCB 50, or the flux on PCB 50. If necessary, pressure may be applied on BGA module 20 so that each of BGA balls 22 and glue 52 is in contact with both BGA module 20 and PCB 50.

Figure 7:
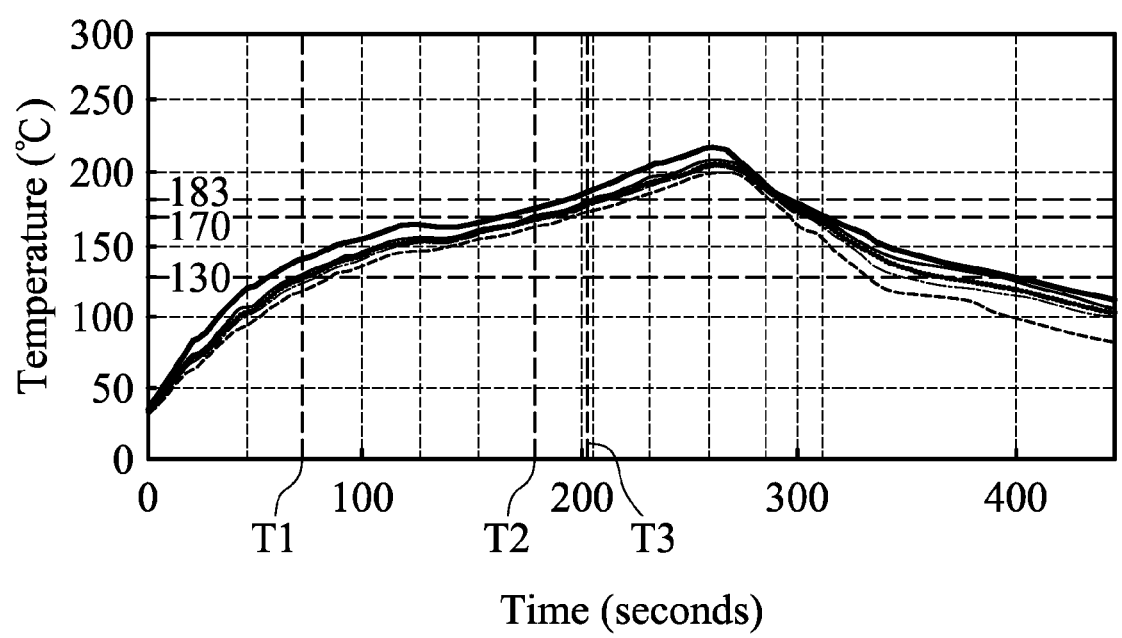
FIG. 7 illustrates temperatures of the structures shown in FIG. 6 as a function of time during a re-flow process.

Next, a re-flow is performed. FIG. 7 illustrates the temperatures of re-flowed samples (as shown in FIG. 6) as a function of time. In the re-flow, the temperature gradually increases until it reaches the melting temperature of BGA balls 22. After the re-flow of BGA balls 22, the temperature gradually decreases.

Assume in the re-flow step that the melting of BGA balls 22 occurs starting at time T3. Accordingly, it is preferred that the curing of glue 52 is finished at time T2 earlier than time T3, wherein the curing may start at time T1 and finish at time T2. When the curing is finished, glue 52 is solidified and glues (clamps) BGA module 20 onto PCB 50, so that BGA module 20 is unable to warp freely. Accordingly, the warpage value of BGA module 20 is fixed approximately to the warpage it has at time T2 or earlier even through the temperature will increase more. Since PCB 50 is likely to have a positive warpage during the increase in temperature, the increase in the warpage value of BGA module 20 will at least be reduced, and possibly be substantially eliminated. To maximize the effect, the curing of glue 52 needs to finish before the occurrence of excessive warpage in BGA module 20, for example, before the temperature of BGA module 20 rises to higher than about 170° C. Otherwise, at the time glue 52 is cured and able to clamp BGA module 20, it is already too late. Further, the temperature at which glue 52 finishes curing and the temperature at which BGA balls 22 starts to melt may have a difference greater than about 20° C., or even greater than about 50° C.

In an exemplary embodiment, an adhesive known as Loctite 3536 (a trademark of Henkel) may be used as glue 52. Loctite 3536 can be cured at between about 130° C. and 170° C. in a time period between about one minute and about two minutes. Referring to FIG. 7, in the existing re-flow process, the time period in which the temperature of BGA module 20 rises from 130° C. to 170° C. is about 100 seconds. Therefore, in the existing re-flow process, Loctite 3536 may be cured before the temperature of BGA module 20 reaches 170° C., and there is no need to change the existing re-flow process. When the temperature of BGA module 20 further increases to higher than 170° C., substantially no further warpage will occur to BGA module 20 since the solidified glue 52 has fixed the shape of BGA module 20. At about 183° C., BGA balls 22 that are formed of eutectic solder start to melt.

In alternative embodiments, other glue materials having different curing temperatures and/or curing times may be used as glue 52. The re-flow process may also be modified.

For example, in an embodiment, the temperature of BGA module 20 may be kept relatively stable as soon as the temperature reaches the curing temperature (for example, about 130° C. or even lower if different glue is used), and stays at this temperature until the curing of glue 52 is finished. The temperature of BGA module 20 is then raised to re-flow BGA balls 22. In the embodiment, the warpage of BGA module 20 is substantially fixed to the warpage value that BGA module 20 has at about 130° C.

In yet other embodiments, the curing and the re-flow may be separated into two separate process steps. In the first process step, glue 52 is cured at a temperature lower than the re-flow temperature of BGA balls 22. The temperature may then be lowered, and the re-flow, for example, as shown in FIG. 7, is performed. The curing and the re-flow may be performed in a same chamber/oven or different chambers/ovens. In yet other embodiments, the curing of glue 52 may use methods other than heating, such as ultraviolet curing. Accordingly, the curing of glue 52 may be performed before the re-flow process, or at an early stage of the re-flow process.

The embodiments of the present invention have several advantageous features. By limiting the warpage of BGA module 20 (FIG. 6) using glue, the warpage of BGA module 20 is limited to an acceptable value. By adjusting the material of glue 52 and the curing/re-flow process, the maximum warpage of BGA module 20 can be controlled, so that BGA balls 22 at edges of BGA module 20 can have good contact with PCB 50. Since the curing of glue 52 fits into the existing re-flow process, no additional steps (except applying glue 52) are needed.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. A method of manufacturing an integrated circuit package, the method comprising:
providing a ball grid array (BGA) module comprising BGA balls on a side of the BGA module;
providing a base substrate;
placing the BGA module on the base substrate, wherein the BGA balls are between the BGA module and the base substrate;
applying an adhesive between and contacting the BGA module and the base substrate, wherein the adhesive does not contact the BGA balls;
curing the adhesive; and
re-flowing the BGA balls after the step of curing the adhesive.

2. The method of claim 1, wherein the step of curing the adhesive occurs at a first temperature, and wherein the step of re-flowing the BGA balls occurs at a second temperature higher than the first temperature.

3. The method of claim 1, wherein the step of applying the adhesive is performed before the step of placing the BGA module, and wherein the adhesive is applied on the base substrate.

4. The method of claim 1, wherein the adhesive comprises portions contacting all edges of the BGA module.

5. The method of claim 4, wherein the adhesive comprises discrete drops contacting each edge of the BGA module.

6. The method of claim 4, wherein the adhesive comprises strips contacting each of the all edges of the BGA module.

7. The method of claim 1, wherein the adhesive comprises Loctite 3536.

8. The method of claim 1, wherein the step of curing the adhesive and the step of re-flowing the BGA balls are performed in a same temperature-raising process, and wherein, during the same temperature-raising process, a temperature of the BGA module is continuously increased with no temperature drop occurring until the step of re-flowing the BGA balls is finished.

9. The method of claim 1, wherein the step of curing the adhesive and the step of re-flowing the BGA balls are separate processes, and wherein the method further comprises, between the step of curing the adhesive and the step of re-flowing the BGA balls, reducing a temperature of the BGA module.

10. The method of claim 1, wherein the base substrate comprises a printed circuit board (PCB).

11. A method of manufacturing an integrated circuit package, the method comprising:
providing a ball grid array (BGA) module comprising BGA balls on a side of the BGA module;
providing a printed circuit board (PCB);
applying an adhesive on the PCB;
placing the BGA module on the PCB, with edges of the BGA module contacting the adhesive, wherein the BGA balls are between the BGA module and the PCB and are not in contact with the adhesive;
heating the BGA module and the PCB to cure the adhesive; and
re-flowing the BGA balls after the adhesive is cured.

12. The method of claim 11, wherein the step of heating the BGA module and the PCB and the step of re-flowing the BGA balls are portions of a same continuous temperature-raising process.

13. The method of claim 11, wherein the step of heating the BGA module and the PCB and the step of re-flowing the BGA balls are separate temperature-raising processes, and wherein the method further comprises, between the step of heating the BGA module and the PCB and the step of re-flowing the BGA balls, lowering a temperature of the BGA module and the PCB.

14. The method of claim 11, wherein the adhesive is cured at a first temperature and the BGA balls start melting at a second temperature, and wherein a difference between the first temperature and the second temperature is greater than about 50° C.

15. The method of claim 11, wherein the adhesive comprises discrete drops distributed along all edges of the BGA module.

* * * * *